(12) United States Patent
de Jong et al.

(10) Patent No.: US 7,944,732 B2
(45) Date of Patent: May 17, 2011

(54) INTEGRATED CAPACITOR WITH ALTERNATING LAYERED SEGMENTS

(75) Inventors: Jan Lodewijk de Jong, Cupertino, CA (US); Steven Baier, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 209 days.

(21) Appl. No.: 12/276,280

(22) Filed: Nov. 21, 2008

(65) Prior Publication Data

US 2010/0127309 A1 May 27, 2010

(51) Int. Cl.
*G11C 11/24* (2006.01)
*G11C 5/02* (2006.01)
*G11C 5/06* (2006.01)

(52) U.S. Cl. ............ 365/149; 365/51; 365/63; 257/208; 257/532; 257/E27.07; 257/E29.343

(58) Field of Classification Search ............ 365/51, 365/63, 149; 257/208, 532, E27.07, E29.343
See application file for complete search history.

(56) References Cited

U.S. PATENT DOCUMENTS

| | | |
|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |

(Continued)

FOREIGN PATENT DOCUMENTS

DE 25 48 563 A1 5/1977

(Continued)

OTHER PUBLICATIONS

Fukuda, H. et al., "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

(Continued)

*Primary Examiner* — Ly D Pham
(74) *Attorney, Agent, or Firm* — Scott Hewett

(57) ABSTRACT

A capacitor in an integrated circuit ("IC") has a first node plate link formed in a first metal layer of the IC electrically connected to and forming a portion of a first node of the capacitor extending along a first axis (y) and a second node plate link formed in a second metal layer of the IC extending along the axis and connected to the first node plate with a via. A third node plate link formed in the first metal layer is electrically connected to and forming a portion of a second node of the capacitor and extends along a second axis (x) of the node plate array transverse to the first node plate link, proximate to an end of the first node plate link and overlying a portion of the second node plate link.

14 Claims, 7 Drawing Sheets

U.S. PATENT DOCUMENTS

| | | | |
|---|---|---|---|
| 4,994,688 A | 2/1991 | Horiguchi et al. |
| 5,005,103 A | 4/1991 | Kwon et al. |
| 5,021,920 A | 6/1991 | Smith |
| 5,077,225 A | 12/1991 | Lee |
| 5,083,184 A | 1/1992 | Eguchi |
| 5,089,878 A | 2/1992 | Lee |
| 5,117,114 A | 5/1992 | Street et al. |
| 5,119,169 A | 6/1992 | Kozono et al. |
| 5,142,639 A | 8/1992 | Kohyama et al. |
| 5,155,658 A | 10/1992 | Inam et al. |
| 5,166,858 A | 11/1992 | Frake et al. |
| 5,172,299 A | 12/1992 | Yamada et al. |
| 5,177,410 A | 1/1993 | Hashiguchi et al. |
| 5,189,594 A | 2/1993 | Hoshiba |
| 5,208,725 A | 5/1993 | Akcasu |
| 5,275,974 A | 1/1994 | Ellul et al. |
| 5,583,359 A | 12/1996 | Ng et al. |
| 5,712,813 A | 1/1998 | Zhang |
| 5,868,388 A | 2/1999 | Wood et al. |
| 5,939,766 A | 8/1999 | Stolmeijer et al. |
| 6,037,621 A | 3/2000 | Wilson |
| 6,064,108 A | 5/2000 | Martinez |
| 6,066,537 A | 5/2000 | Poh |
| 6,297,524 B1 | 10/2001 | Vathulya et al. |
| 6,303,456 B1 | 10/2001 | Pricer et al. |
| 6,303,457 B1 | 10/2001 | Christensen et al. |
| 6,383,858 B1 | 5/2002 | Gupta et al. |
| 6,385,033 B1 | 5/2002 | Javanifard et al. |
| 6,410,954 B1 | 6/2002 | Sowlati et al. |
| 6,417,556 B1 | 7/2002 | Long et al. |
| 6,542,351 B1 | 4/2003 | Kwang |
| 6,570,210 B1 | 5/2003 | Sowlati et al. |
| 6,597,562 B1 | 7/2003 | Hu et al. |
| 6,625,006 B1 | 9/2003 | Aram et al. |
| 6,653,681 B2 | 11/2003 | Appel |
| 6,661,079 B1 | 12/2003 | Bikulcius |
| 6,690,570 B2 | 2/2004 | Hajimiri et al. |
| 6,737,698 B1 | 5/2004 | Paul et al. |
| 6,747,307 B1 | 6/2004 | Vathulya et al. |
| 6,765,778 B1 | 7/2004 | Du et al. |
| 6,819,542 B2 | 11/2004 | Tsai et al. |
| 6,822,312 B2 | 11/2004 | Sowlati et al. |
| 6,880,134 B2 | 4/2005 | Drennan |
| 6,882,015 B2 | 4/2005 | Bernstein et al. |
| 6,897,505 B2 | 5/2005 | Aton |
| 6,903,918 B1 | 6/2005 | Brennan |
| 6,927,125 B2 | 8/2005 | Jones et al. |
| 6,933,551 B1 | 8/2005 | Stribley et al. |
| 6,949,781 B2 | 9/2005 | Chang et al. |
| 6,963,122 B1 | 11/2005 | Soenen et al. |
| 6,974,744 B1 | 12/2005 | Aram et al. |
| 7,009,832 B1 | 3/2006 | Chen et al. |
| 7,013,436 B1 | 3/2006 | Morton et al. |
| 7,027,287 B2 | 4/2006 | Georgakos |
| 7,038,296 B2 | 5/2006 | Laws |
| 7,050,290 B2 | 5/2006 | Tang et al. |
| 7,116,544 B1 | 10/2006 | Sutardja |
| 7,154,734 B2 | 12/2006 | Schultz et al. |
| 7,161,228 B1 | 1/2007 | Pettit |
| 7,170,178 B2 | 1/2007 | Bely et al. |
| 7,193,263 B2 | 3/2007 | Barth |
| 7,195,971 B2 | 3/2007 | Bernstein et al. |
| 7,202,548 B2 | 4/2007 | Lee |
| 7,259,956 B2 | 8/2007 | Fong et al. |
| 7,271,465 B2 | 9/2007 | Jessie et al. |
| 7,274,085 B1 | 9/2007 | Hsu et al. |
| 7,298,001 B1 | 11/2007 | Liu |
| 7,348,624 B2 | 3/2008 | Sakaguchi et al. |
| 7,485,914 B2 | 2/2009 | Huang et al. |
| 7,663,233 B2 | 2/2010 | Lim |
| 7,768,054 B2 | 8/2010 | Benetik |
| 2005/0077581 A1 | 4/2005 | Chang et al. |
| 2005/0135042 A1 | 6/2005 | Chiu-Kit Fong et al. |
| 2005/0161725 A1 | 7/2005 | Da Dalt |
| 2006/0203424 A1 | 9/2006 | Chen et al. |
| 2007/0181973 A1 | 8/2007 | Hung et al. |
| 2007/0190760 A1 | 8/2007 | Coolbaugh et al. |
| 2007/0278551 A1 | 12/2007 | Anthony |
| 2007/0296013 A1 | 12/2007 | Chang et al. |
| 2009/0057826 A1 | 3/2009 | Kim et al. |

FOREIGN PATENT DOCUMENTS

| | | |
|---|---|---|
| DE | 100 46 910 A1 | 10/2001 |
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| WO | WO 03/090280 | 10/2003 |

OTHER PUBLICATIONS

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

Amintoosi et al., "Using pattern matching for tiling and packing problems" European Journal of Operational Research, Amsterdam, NL, vol. 83, No. 3, Jul. 10, 2007, pp. 950-960.

Jacobsen, Jesper, Lykke "Tetromino tilings and the Tutte polynomial", Journal of Physics A: Mathematical and Theoretical, vol. 40, No. 7, Feb. 16, 2007. pp. 1439-1446.

U.S. Appl. No. 12/276,289, filed Nov. 21, 2008, Quinn, Patrick J., Xilinx, Inc. 2100 Logic Drive, San Jose, California.

U.S. Appl. No. 12/276,291, filed Nov. 21, 2008, Quinn, Patrick J., Xilinx, Inc. 2100 Logic Drive, San Jose, California.

U.S. Appl. No. 12/276,292, filed Nov. 21, 2008, Quinn, Patrick J., Xilinx, Inc. 2100 Logic Drive, San Jose, California.

U.S. Appl. No. 12/276,293, filed Nov. 21, 2008, Quinn, Patrick J., Xilinx, Inc. 2100 Logic Drive, San Jose, California.

U.S. Appl. No. 12/276,296, filed Nov. 21, 2008, Quinn, Patrick J., Xilinx, Inc. 2100 Logic Drive, San Jose, California.

Aparicio and Hajimiri, "Capacity Limits and Matching Properties of Integrated Capacitors", IEEE J. Solid-State circuits, vol. 37, No. 3, pp. 384-393, Mar. 2002.

Samavati, H. et al., "Fractal Capacitor", IEEE Journal of Solid-State Circuit, vol. 33, No. 12 pp. 2035-2041, Dec. 1998.

Chan et al., "Analysis of MMIC Structures Using an Efficient Iterative Approach", IEEE Transactions on Microwave Theory and Techniques, vol. 36, No. 1, Jan. 1988, pp. 96-105.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Rajagopalan et al., "Optimization of Metal-Metal Comb-Capacitors for RF Applications", Wireless Design & Development, Mar. 4, 2001, pp. 1-4.

Sowlati et al., "High Density Capacitance Structures in Submicron CMOS for Low Power RF Applications", International Symposium on Low Power Electronics and Design, 2001, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

US 7,944,732 B2

INTEGRATED CAPACITOR WITH ALTERNATING LAYERED SEGMENTS

RELATED APPLICATIONS

This patent application is being concurrently filed with commonly owned U.S. patent application entitled SHIELDING FOR INTEGRATED CAPACITORS by Patrick J. Quinn; and with commonly owned U.S. patent application entitled INTEGRATED CAPACITOR WITH TARTAN CROSS SECTION; and with commonly owned U.S. patent application entitled INTEGRATED CAPACITOR WITH INTERLINKED LATERAL FINS by Patrick J. Quinn; and with commonly owned U.S. patent application entitled INTEGRATED CAPACITOR WITH CABLED PLATES by Patrick J. Quinn; and with commonly owned U.S. patent application entitled INTEGRATED CAPACITOR WITH ARRAY OF CROSSES by Patrick J. Quinn; the disclosures of which are each hereby incorporated by reference in their entireties for all purposes.

FIELD OF THE INVENTION

The present invention relates to capacitors formed in integrated circuits ("ICs") commonly referred to as "integrated capacitors".

BACKGROUND OF THE INVENTION

Methods of fabricating ICs typically include a front-end sequence of processing, in which various electrical devices such as transistors are formed in a semiconductor substrate, and a back-end sequence of processing, generally including forming alternating layers of dielectric material and patterned conductive material (typically metal) with conductive vias or other techniques being used to interconnect the metal layers to form a three-dimensional wiring structure that connects electrical devices to other electrical devices and to terminals of the IC.

Capacitors are used in IC systems for a variety of purposes. In many instances, it is desirable to incorporate (integrate) a capacitor in the IC chip. A simple approach is to form two conductive plates with an intervening dielectric; however, this consumes a relatively large area for the capacitance obtained. One technique for increasing the capacitance of a given area is to use multiple conductive plates, each conductive plate separated from the proximate plate(s) by dielectric. Further techniques use conducting strips, also called conductive lines, conductive fingers, or conductive traces that are alternately connected to the first and second capacitor terminals (nodes). Sidewall coupling between the conductive strips provides capacitance. Layers of conducting strips, either offset or arranged in vertical congruency, can be added to further increase the capacitance of an integrated capacitor structure.

One capacitor has a number of conductive strips in successive layers connected to the first node alternating with an equal number of conductive strips connected to the second node of the integrated capacitor. The conductive strips are offset a half cell on successive layers, so that a conductive strip connected to the first node has conductive strips connected to the second node above and on both sides of it. Providing an equal number of conductive strips in a layer for each node balances the coupling of each node to the substrate, which is desirable in some applications, but undesirable in others, such as switching applications where it is desirable to have less coupling at one node.

Another approach to providing an integrated capacitor is to have conductive strips in a layer connected to alternate nodes of the capacitor with overlapping conductive strips connected to the same node. This forms essentially a curtain of conductive strips and interconnecting vias connected to the first node of the capacitor with adjacent curtains of conductive strips and interconnecting vias connected to the second node. Overlapping conductive strips connected to the same node avoids the lost surface area associated with buss strips; however, inter-layer capacitance is reduced because the upper strip is connected to the same node as the lower strip. This effect is somewhat obviated because, as critical dimensions shrink, inter-strip capacitance becomes more dominant than inter-layer capacitance. In other words, the dielectric layer separation between successive metal layers becomes increasingly greater than the dielectric separation between conductive strips with decreasing critical dimension.

Long, parallel, conductive fingers often present design restrictions, such as minimum width for a given length in a given metal layer. In some designs, long conductive fingers present an undesirable inductance-resistance profile, with the inductance increasing with increasing length of the finger.

Thus, integrated capacitors overcoming the disadvantages of prior art are desired. It is further generally desired that integrated capacitors have high capacitance per unit area, low loss (resistance), and low self-inductance, which improves high-frequency applications by increasing self-resonant frequency and the quality of capacitor circuits.

SUMMARY OF THE INVENTION

A capacitor in an integrated circuit ("IC") has a first node plate link formed in a first metal layer of the IC electrically connected to and forming a portion of a first node of the capacitor extending along a first axis and a second node plate link formed in a second metal layer of the IC extending along the axis and connected to the first node plate with a via. A third node plate link formed in the first metal layer is electrically connected to and forming a portion of a second node of the capacitor and extends along a second axis of the node plate array transverse to the first node plate link, proximate to an end of the first node plate link and overlying a portion of the second node plate link.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Complex ICs, such as programmable logic devices, often have several patterned metal layers separated by layers of dielectric material formed over a semiconductor substrate that are used for wiring connections and other functions commonly called the "backend" of the IC. Some embodiments of the invention are adaptable to existing CMOS process sequences by using masks that form the desired patterns in the appropriate metal layers and vias through the inter-metal dielectric ("IMD") layers or inter-layer dielectric ("ILD") in the backend of the IC. The vias are formed using any of several known techniques, such as contact plug, damascene, or dual damascene techniques. Similarly, the conductive strips are formed using any of several known techniques, such as thin-film metal etch, thin-film metal lift-off, damascene, and dual damascene techniques. In some embodiments, one of the conductive layers is a polysilicon or silicide layer. In a further embodiment, a conductive well in the semiconductor substrate forms a portion of a capacitor plate or a shield.

FPGAs (field programmable gate arrays) use integrated capacitors in a variety of circuit applications, such as filtering capacitors, switching capacitors, and RF coupling capacitors. Embodiments of integrated capacitors are scalable to provide a wide range of total capacitance values for use in various circuit applications. High specific capacitance (the capacitance per unit area of silicon) can be achieved while retaining low resistive and inductive impedance, and high total capacitance is obtained in small area, keeping IC chip size small. Capacitors are generally useful in a wide variety of integrated circuits and in a wide variety of applications. For instance, one or more capacitors may be useful for a switched capacitor network, such as in an analog-to-digital converter, or as a decoupling or filtering capacitor for AC signaling (e.g., in an MGT). In general, the capacitor structure described herein may be useful in any application requiring capacitance.

Figure 1A:
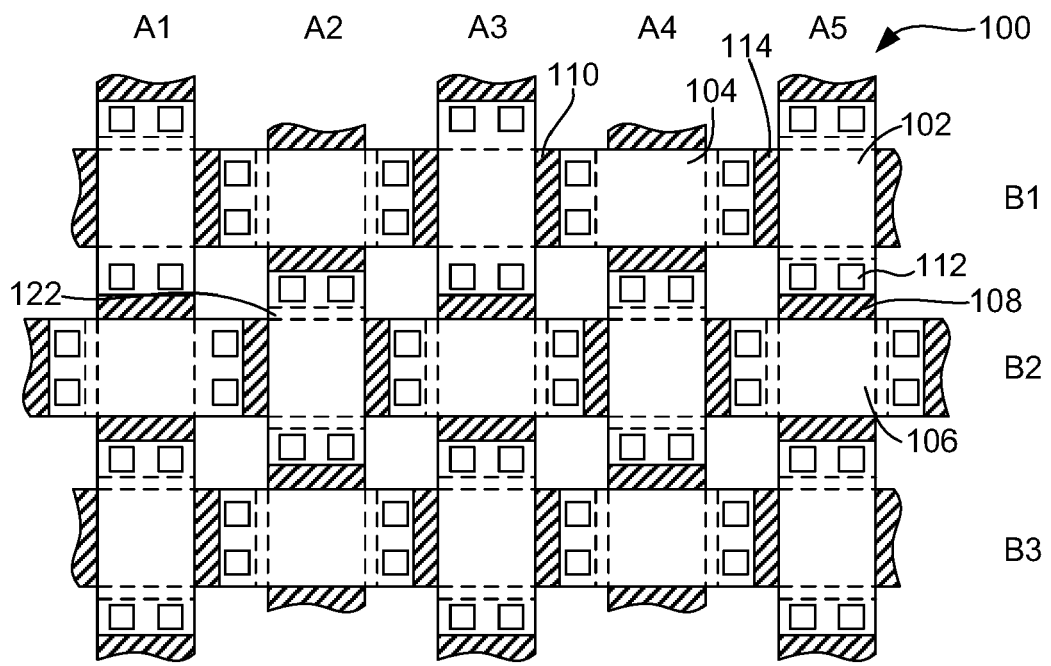
FIG. 1A is a plan view of a portion of an integrated capacitor according to an embodiment of the invention.

FIG. 1A is a plan view of a portion of an integrated capacitor 100 according to an embodiment of the invention. The plan view shows portions of two patterned conductive layers in an IC with the intervening dielectric material removed. The lower metal layer is shown with hatching to more clearly distinguish features in the lower metal layer from those in the upper metal layer. Additionally, metal features in the lower layer extending beneath metal features in the upper layer are shown with dashed lines for improved illustration of the two-layer structure.

The integrated capacitor has a first node A and a second node B. In some embodiments, the A and B nodes are the top and bottom nodes of a switching capacitor in an IC. In some switching capacitor applications, it is particularly desirable to shield the top node from electrical noise or stray coupling. In other embodiments, the A and B nodes are balanced nodes of an RF coupling capacitor. In some RF coupling applications, it is particularly desirable that one node present essentially the same impedance as the other node, and that the capacitor have a high self-resonant frequency. In yet other embodiments, the A and B nodes are nodes of a filtering capacitor. High specific capacitance and high total capacitance are usually desirable in filtering capacitors. Note that a capacitor is generally thought of as a two terminal device, and the "top" and "bottom" nodes as described herein generally correspond to these two terminals of the capacitor. Thus, the structures described below may be thought of as connecting (e.g., electrically) to one or the other node, or forming portions of a node. A node is not separate from the capacitive structures connected to it, but those structures may form portions of a node.

The integrated capacitor 100 is made up of several node plate links 102, 104, 106, 108, 110. The node plate links are substantially identical, but alternative embodiments use different links in different layers, or different links within a layer. Additional embodiments use additional conductive elements connected to node plate links (see, e.g., the central "H-elements" shown in FIG. 2A) in the node plate array(s). The node plate links are rectangular with a length:width aspect ratio from about 1.5:1 to about 5:1. The node links with the lower aspect ratio typically have more than one contact between layers (see, e.g., FIG. 1A, ref. num. 104). Node links with a single contact (see, e.g., FIG. 2C, ref. num. 217) may have a higher aspect ratio. In a particular embodiment, a node plate link (see, e.g., FIG. 2C, ref. num. 217) has a width that is the minimum design width for a metal trace in the patterned metal layer in which the node plate link is formed, and a length approximately equal to three times the width (e.g., the two square end portions in which the vias are formed and a center square portion where the node plate link overlaps the underlying, transverse node plate link), plus two minimum metal line separations (e.g., the separation between the transverse node plate link underlying link 217 and the ends of the links to the right and left of link 217 (basically, the lengths between the pairs of vertical dashed lines of link 217)). In a particular embodiment, the minimum metal line separation is about equal to the minimum metal line width, resulting in an aspect ratio of about 5:1. In an alternative embodiment, a node plate link is approximately 3 f wide and 6 f long, where f is the critical minimum dimension for the node technology of the metal layer in which the node plate link is formed.

The aspect ratio of the node plate links is relatively low compared to metal filaments used in many conventional integrated capacitors, which often have aspect ratios greater than 100:1. The low aspect ratio of the node plate links provides high specific capacitance by intra-layer (edge-to-edge) capacitance at both ends and both sides of a node plate link connected to the first node to corresponding node plate links connected to the second node (see FIG. 1C and associated description). For purposes of convenient discussion, the length of a node plate link is the longer dimension of the plan view of a node plate link, typically extending between contacts along a first axis of a node plate array, and the width is the shorter dimension, extending along a second axis of the node plate array, which is typically orthogonal to the first axis.

Some node plate links 108, 110 are in the lower metal layer, and other node plate links 102, 104, 106, 122 are in the upper metal layer. Node plate links in one layer (e.g., node plate link 102 in the upper layer) are electrically connected to node plate links in the other layer (e.g., node plate link 108) by conductive vias 112 ("vias"), and the node plate links are sufficiently wide to accommodate at least one, and alternatively two or more, vias. Node plate links alternate from one layer to the next in rows B1, B2, B3 and columns A1, A2, A3, A4, A5 in a "basket-weave" pattern. That is a node plate link 102 in the upper layer extending along column A5 connected to the first node passes over a node plate link 114 in the lower layer extending along B1 connected to the second node. The node plate link 102 is connected in series with a second node plate link 108 extending along column A5 in the lower layer and that passes under a node plate link 106 in the upper layer extending along row B2 that is connected to the second node. This sequence repeats along the rows and columns of the integrated capacitor 100.

In the upper patterned metal layer, the node plate link 102 connected to the first node extends along a first axis over the node plate link 114 in the lower patterned metal layer connected to the second node and extending along a second axis orthogonal to the first axis. The column A5 includes node plate links alternating between the first (upper) and second (lower) metal layer attached to the first node of the integrated capacitor, and the row B1 includes node plate links alternating between the first and second metal layers attached to the second node of the integrated capacitor. In the upper metal layer, extending along a first axis of the node plate link array ("node plate array"), a first node plate link connected to the first node of the integrated capacitor oriented along the first axis (i.e., the long dimension of the node plate link extends along the first axis), then a second node plate link connected to the second node of the integrated capacitor oriented along the second axis, then a third node plate link connected to the first node oriented along the first axis.

Figure 1B:
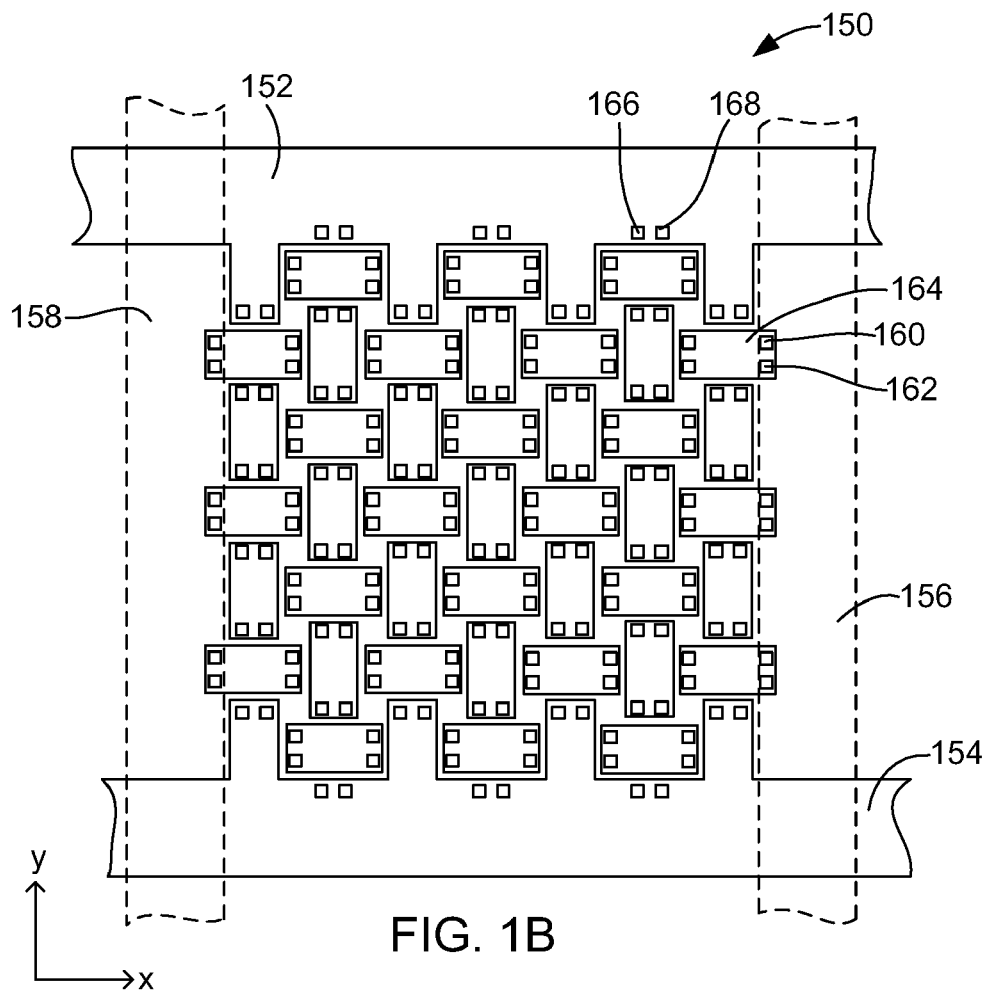
FIG. 1B is a plan view of a node plate array of an integrated capacitor according to an embodiment.

Each node plate link in each column is connected to the A node of the capacitor, and each node plate link in each row is connected to the B node of the capacitor, which is discussed further in reference to FIG. 1B.

The basket-weave pattern provides high specific capacitance with low inductive and resistive impedance components compared to conventional integrated capacitors using long, thin conductive filaments. A node plate link 102 in the upper layer capacitively couples to the node plate link 114 in the lower layer where the links cross (overlap), referred to as "inter-layer capacitance", the end of the node plate link 102 capacitively couples to the edge of the adjacent node plate link 106, referred to as "intra-layer capacitance", and the end of adjacent node plate link 104 capacitively couples to the edge of node plate link 102. Thus, the basket-weave pattern provides both inter-layer and intra-layer capacitance. The ratio of the inter-layer to intra-layer contributions to the total capacitance is selectable by adjusting the aspect ratio and dimensions of the node plate links and the pattern layout. In some embodiments, node plate elements are laid out using minimum spacing rules. In some embodiments, the node plate elements are patterned using minimum metal line width rules and minimum spacing. In alternative embodiments (see, e.g., FIG. 1A), node plate elements are laid out at greater than minimum metal line widths.

In a further embodiment, additional metal layers above or below the two illustrated layers are patterned. For example, a third metal layer (see FIG. 2E) is patterned substantially like the first metal layer and overlies the upper metal layer shown in FIG. 1A. Another patterned metal layer could underlie the lower illustrated layer in a similar fashion. Stacked vias extend from the lowest metal layer through the intermediate metal layer to the uppermost (third) metal layer. Embodiments can have an even number of patterned metal layers, or an odd number of patterned metal layers (greater than one). Additional patterned metal layers increases the specific capacitance of the integrated capacitor.

FIG. 1B is a plan view of a node plate array 150 of an integrated capacitor according to an embodiment. The node plate array 150 is a block of node plate links that is copied and repeated to form a section of the integrated capacitor, similar to how memory cell arrays are stepped and repeated. The number of node plate links in the node plate array is reduced for purposes of illustration. The node plate array 150 has a generally square footprint, which provides highly symmetrical electrical impedance characteristics for both nodes of the capacitor. Alternative embodiments of node plate arrays are not square. In a particular embodiment, the number of rows and columns (and hence the number of links in series along the corresponding columns or rows) in an array are selected to adjust the ratio of capacitance versus series resistance.

Series of node plate links run in rows and columns. Typical node plate link arrays have 10 to 100 node plate links in series in a row or a column. The number of links in series between bus bars ("metal wires") or other common node connectors is determined by a number of factors, such as the desired capacitance and impedance characteristics of the integrated capacitor. For example, vias can have relatively high series resistance. One embodiment might use narrow node plate links with a single via, while another embodiment uses wider node plate links with two or more vias in each tier. Using wider node plate links enhances inter-layer capacitance and provides low series resistance through the multiple (parallel) vias, but reduces intra-layer capacitance by reducing the total length of edge-to-edge coupling for a given area of the node plate array, thus the ratio of intra-layer capacitance to inter-layer capacitance can be adjusted (selected) according to the aspect ratio of the node plate links.

Columns of node plate links extend between a first bus bar 152 and a second bus bar 154 generally parallel to the first bus bar along a first axis (the X-axis) of the node plate array, and rows of node plate links extend between a third bus bar 156 and a fourth bus bar 158 that extending along a second axis (the Y-axis) of the node plate array. The third and fourth bus bars 158, 156 are shown in dashed lines to indicate that they are patterned in the lower metal layer and in a simplified fashion for clarity of illustration. Vias 160, 162 electrically connect the node plate link 164 in the upper layer to the bus bar 156 in the lower layer. Similarly, vias 166, 168 connect the first bus bar 152 to a node plate link (not shown) in the lower metal layer (see, e.g., FIG. 1A). Other arrangements of bus bars are alternatively used. For example, the vertical and horizontal bus bars are patterned substantially in a single metal layer, using any of several cross-over techniques where the bus bars cross or would otherwise intersect.

The bus bars are generally low-resistance, low-impedance elements that connect one or more node plate link arrays to the circuit nodes of the integrated capacitor. Providing a bus bar along opposite edges of the node plate link array 150 presents a symmetrical electrical environment, and reduces the series resistance and inductance that would arise in a single-ended row or column. In other words, a node plate link in the center of the array has a similar resistance to each of the bus bars, basically providing two resistors in parallel and reducing the apparent series resistance.

In a typical integrated capacitor, many node plate link arrays are connected to the bus bars. For example, additional node plate link arrays (not shown) are connected to the left and right of bus bars 156, 158, or above or below bus bars 152, 154. Using a standard node plate link array makes it easy to fabricate integrated capacitors of different values and different physical sizes. Some embodiments of integrated capacitors use a single node plate array.

Integrated capacitors using a basket-weave pattern technique provide good manufacturing consistency and high specific capacitance. Manufacturing consistency (i.e., low variation across a wafer or across an IC, and low lot-to-lot variation) is particularly desirable in physically large ICs, such as FPGAs, where integrated capacitors might be physically separated across relatively large distances on the IC chip. Embodiments using node plate elements fabricated at greater than minimum metal linewidth (see, e.g., the node plate links of FIG. 1A which are sufficiently wide to accommodate two vias) provide good consistency across a wafer of many ICs and good wafer-to-wafer and lot-to-lot consistency. Integrated capacitors fabricated at greater than minimum metal line width provide high specific capacitance and high manufacturing yield, compared to conventional filament-type capacitors fabricated at minimum metal linewidths.

Figure 1C:
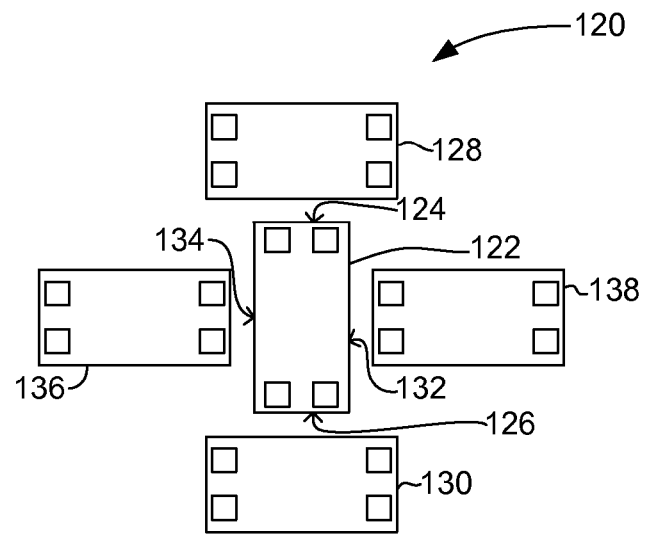
FIG. 1C is a plan view of a portion of the upper metal layer of FIG. 1A.

FIG. 1C is a plan view of a portion 120 of the upper metal layer of FIG. 1A. A node plate link 122 (e.g., the node plate link in column A2 at the intersection of row B2 of FIG. 1A) connected to one node (i.e., node A) has ends 124, 126 adjacent to node plate links 128, 130 connected to the other node (i.e., node B). The sides 132, 134 of the node plate link 122 are also adjacent to node plate links 136, 138 connected to the other node. The ends 124, 126 of the node plate link 122 couple with the sides of the opposite node plate links 128, 130 to provide intra-layer capacitance. Similarly, the sides 132, 134 of the node plate link 122 couple with the ends of the opposite node plate links 136, 138 to provide additional intra-layer capacitance. Rectangular node plate links arranged using a basket-weave technique provide intra-layer capacitance at the ends and sides of the conductive elements, thus providing high specific capacitance.

Figure 2A:
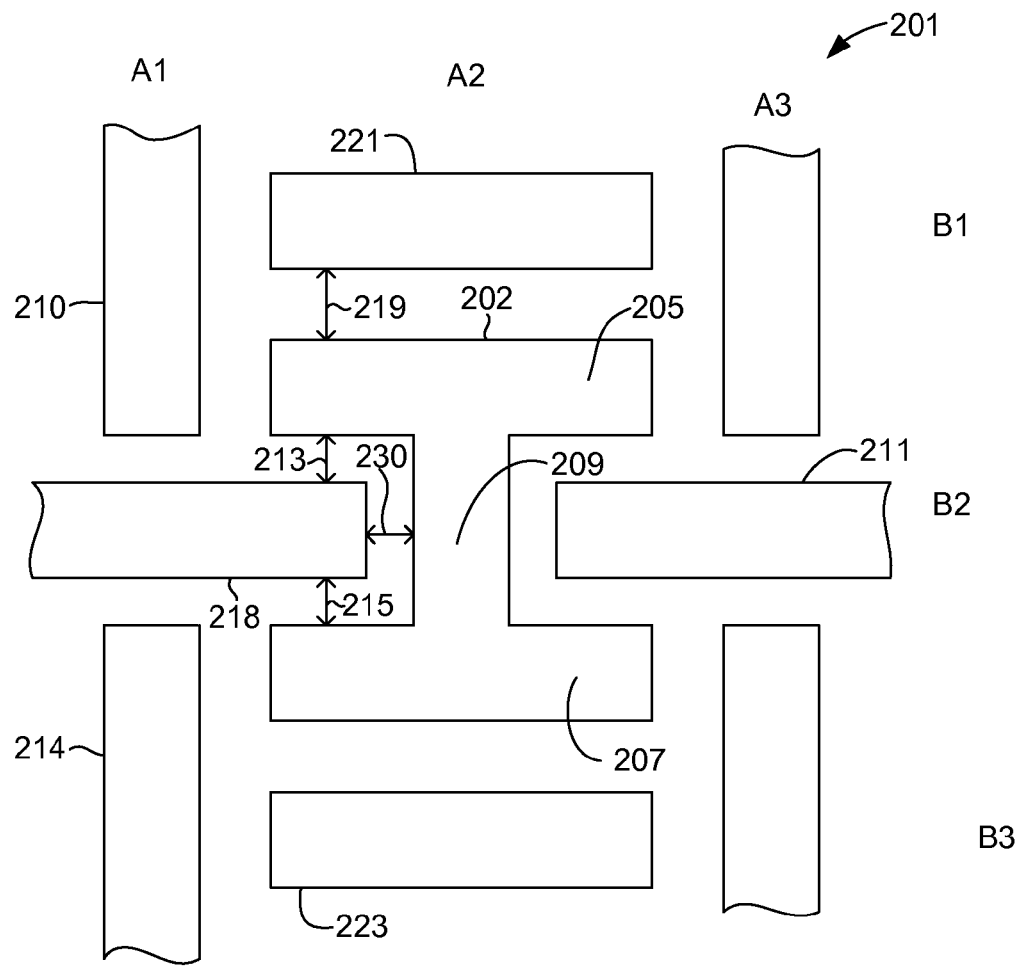
FIG. 2A is plan view of a portion of a first patterned metal layer of a node plate array.

FIG. 2A is plan view of a portion of a first patterned metal layer 201 (i.e., the upper metal layer in FIG. 2C) of a node plate array. Node plate links 210, 214, 211, 218 are arranged along columns A1, A2, A3 and rows B1, B2, B3. An H-element 202 has side elements 205, 207 and cross element 209 extending between the side elements. The H-element 202 is connected to the A node, as are node plate links 210 and 214. The cross element 209 extends along the direction of the columns, as do the node plate links connected to node A, while the side elements 205, 207 extend along the direction of the rows, as do the node plate links connected to node B. This allows the side elements to couple to B-node link plates in the rows along a longer edge than an end edge of a simple rectangular link (compare, FIG. 1C, ref. nums. 124, 126), thus providing increased intra-layer capacitance. For example, the intra-layer coupling 213, 215 between the H-element 202 and node plate link 218 is added to the end-to-side coupling 230 that would occur if the H-element were replaced with a rectangular link. Additionally, the side element 205 couples to node plate link 221 as indicated by the double-ended arrow 219. One of ordinary skill in the art of integrated capacitors will appreciate that the side elements of the H-element provide additional intra-layer capacitance to other node plate links, such as links 211 and 223.

Figure 2B:
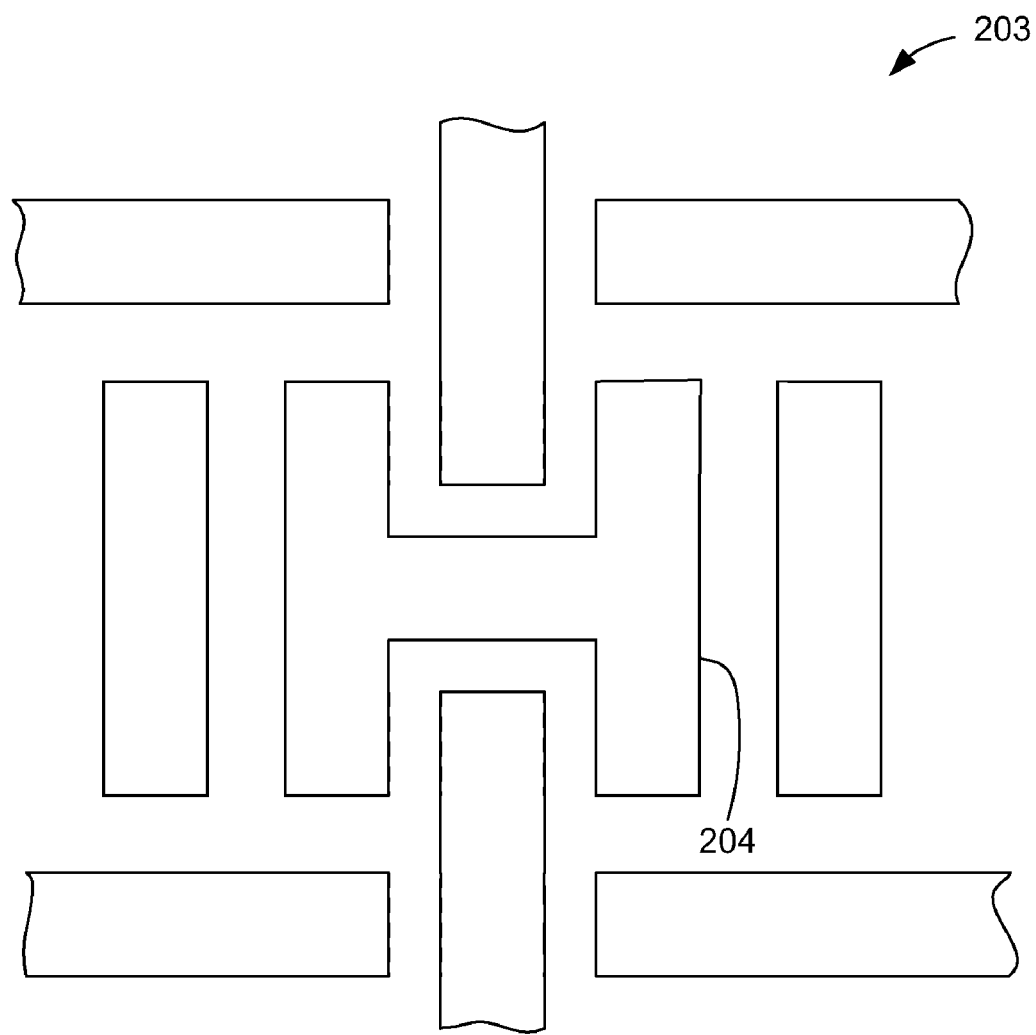
FIG. 2B is a plan view of a portion of a second patterned metal layer of a node plate array.

FIG. 2B is a plan view of a portion of a second patterned metal layer 203 (i.e., the lower metal layer in FIG. 2C) of a node plate array. The portion of the second patterned metal layer 203 is substantially similar to the portion of the first patterned metal layer of FIG. 2A rotated ninety degrees. Therefore, a detailed description of this portion of the second patterned metal layer is omitted. The second-H-element increases intra-layer capacitance, as described above in reference to FIG. 2A, and also increased inter-layer capacitance, as described below in reference to FIG. 2C.

Figure 2E:
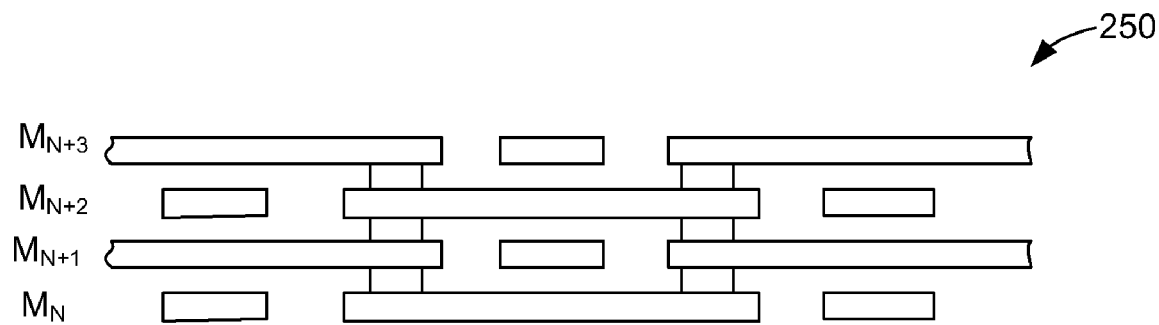
FIG. 2E is a cross section of a portion of a four-layer integrated capacitor 250 according to another embodiment.
Figure 2C:
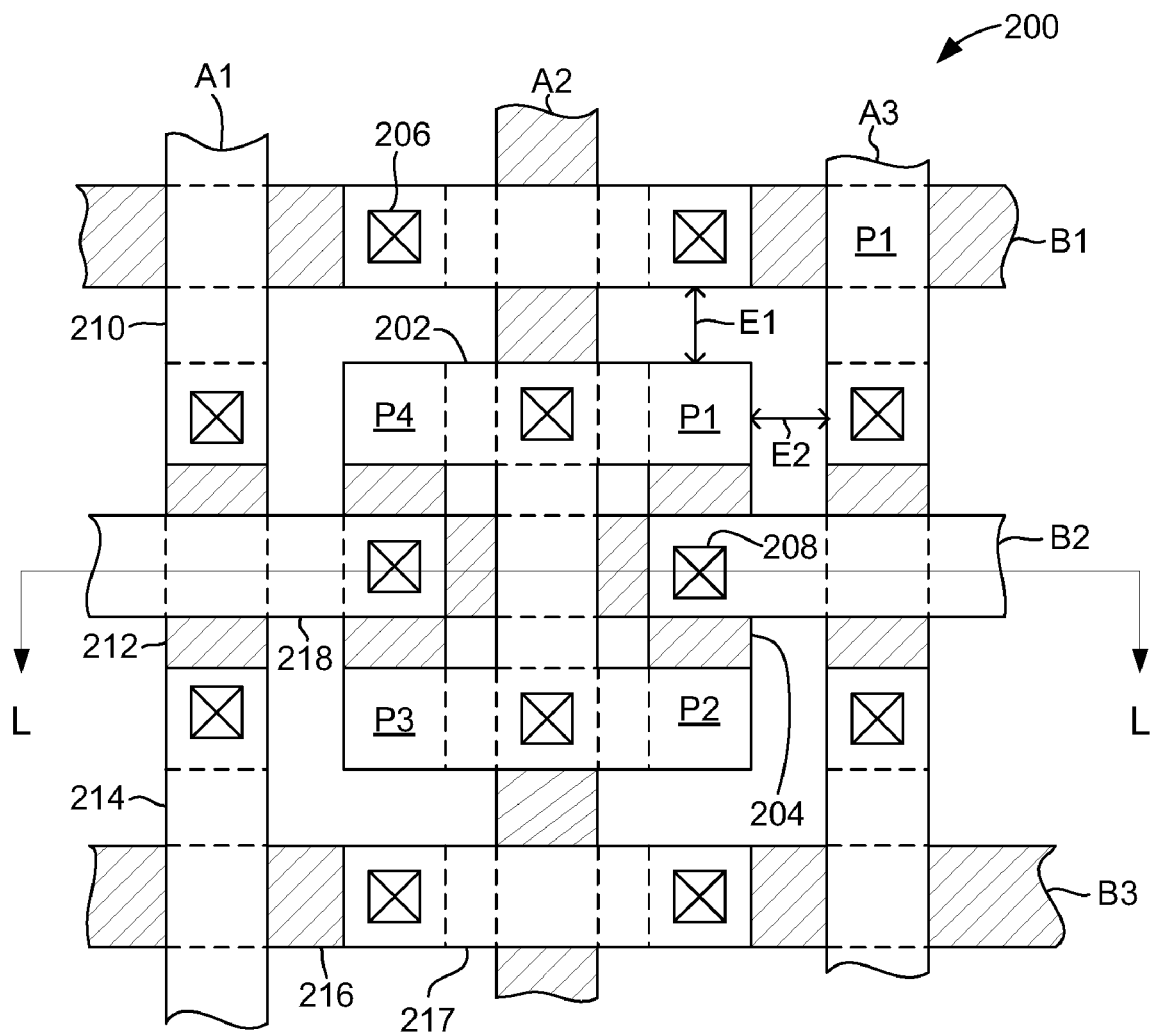
FIG. 2C is a plan view of a portion of a node plate array of an integrated capacitor according to another embodiment.

FIG. 2C is a plan view of a portion of a node plate array 200 of an integrated capacitor according to another embodiment. The upper metal layer of FIG. 2A is shown without hatching and is superimposed on the lower metal layer of FIG. 2B, which is shown with hatching. The H-element 202 is defined in the upper conductive (e.g., metal or polysilicon/silicide) layer and the second H-element 204 is defined in the lower conductive layer. The second H-element 204 is rotated ninety degrees from the first H-element 202. Vias 206, 208 electrically connect conductive node elements together. The first H-element 202 is connected to a first node (node A) through the node plate links and vias of column A2 and the second H-element 204 is connected to a second node (node B) of the integrated capacitor through node plate links and vias of row B2. Electrical connections to the first node are made along columns A1, A2, A3, while electrical connections to the second node are made along rows B1, B2, B3. The designation of axis as a row or as a column is arbitrary and the terms are used merely for purposes of convenient discussion. Node plate links 210, 212, 214 connected to the first node alternate in conductive layers with orthogonal plate segments 216, 218, 220 connected to the second node in a "basket weave" pattern, as described above in reference to FIGS. 1A and 1B.

Figure 2D:
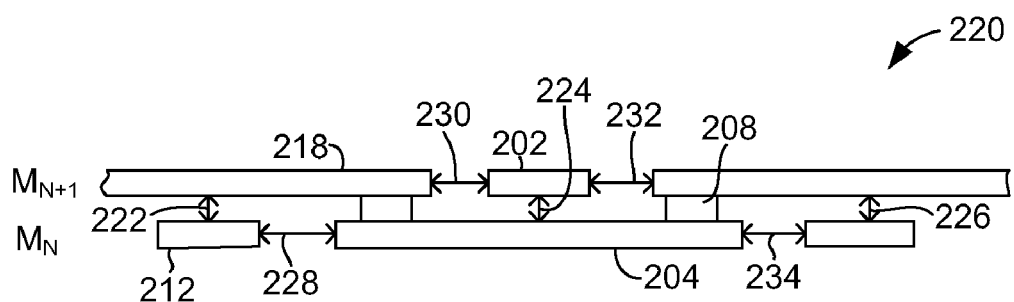
FIG. 2D is a cross section of the node plate array of FIG. 2C taken along section line L-L.
Figure 3A:
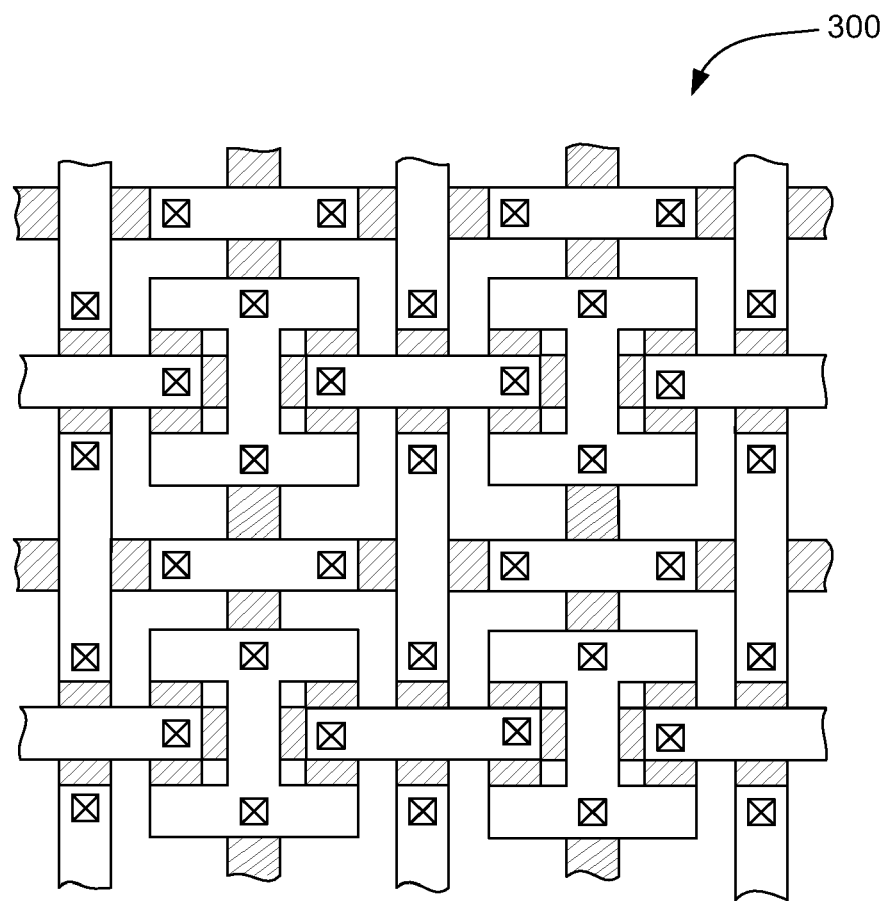
FIG. 3A is a plan view of a portion of a node plate array using a pattern in accordance with FIG. 2C.

In some embodiments, the pattern of FIG. 2C is repeated along rows and columns to form a node plate array (see, e.g., FIG. 3A). The H-elements increase intra-layer capacitance as described above in reference to FIG. 2A, and also increase inter-layer capacitance in regions P1, P2, P3, and P4 where the side elements of the first and second H-elements overlap, and as further illustrated below in reference to FIG. 2D. The ratio of inter-layer capacitance to intra-layer capacitance is variable according to the width and length of the plate segments and the intra-layer line spacing.

FIG. 2D is a cross section 220 of the node plate array 200 of FIG. 2C taken along section line L-L. The section line extends through node plate link 218, H-elements 202 and 204, and via 208 of FIG. 2C. Sections of node plate links 212, 218 and H-elements 202, 204 capacitively couple to conductive elements. Inter-layer coupling 222, 224, 226 and intra-layer coupling 228, 230, 232, 234 are represented with double-ended arrows. The spacings between conductive elements are exaggerated for purposes of illustration. The node plate elements are formed in a first (lower) conductive layer $M_N$ and in a second (upper) conductive layer $M_{N+1}$. In a particular embodiment, $M_N$ and $M_{N+1}$ are both metal layers. Alternatively, one or both is a polysilicon or silicide layer.

FIG. 2E is a cross section of a portion of a four-layer integrated capacitor 250 according to another embodiment. The pattern in a third conductive layer MN+2 is essentially the same as the pattern in the first conductive layer MN. Similarly, the pattern in a fourth conductive layer MN+3 is essentially the same as the pattern in the second conductive layer MN+1. Embodiments can include an odd number of layers, or an even number of layers. Additional patterned conductive layers increase the specific capacitance of the integrated capacitor.

FIG. 3A is a plan view of a portion of a node plate array 300 using a pattern in accordance with FIG. 2C. Node plate H-elements are linked along rows and columns, generally alternating with node plate links (compare, FIG. 1A). The pattern repeats to form a node plate array (see, e.g., FIG. 3B, ref. num. 312). In a particular embodiment, the pattern repeats along rows and columns to form an essentially square node plate array that provides essentially interchangeable first and second nodes.

Figure 3B:
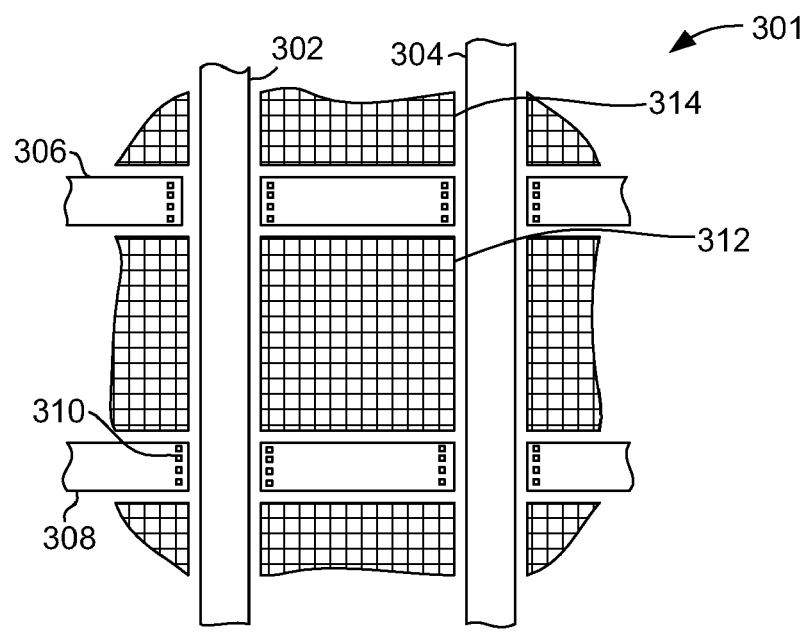
FIG. 3B is a plan view of a portion of an integrated capacitor in an IC according to an embodiment.

FIG. 3B is a plan view of a portion of an integrated capacitor 301 in an IC according to an embodiment. Bus bars 302, 304, 306, 308 connect node plate arrays (see, e.g., FIG. 1A and FIGS. 2C, 2D) 314, 312 to the IC circuit nodes of the integrated capacitor. As discussed above in reference to the node plate arrays, the horizontal bus bars 306, 308 electrically connect the columnar elements of the node plate arrays, and the vertical bus bars 302, 304 electrically connect the row elements of the node plate arrays. The bus bars 302, 304, 306, 308 are all formed in the same metal layer and crossovers (in a separate layer not shown in the figure) using vias 310 are used. Alternatively, bus bars connected to the first node are defined in a first metal layer, and bus bars connected to the second node are defined in a second metal layer (compare, FIG. 1B). In a particular embodiment, each node plate array is surrounded by bus bars (see, e.g., FIG. 1B). Alternatively, the perimeter node plate arrays in the integrated capacitor are not surrounded. In a particular embodiment, each node plate array has about twenty unit cells in accordance with FIG. 2A.

Figure 4:
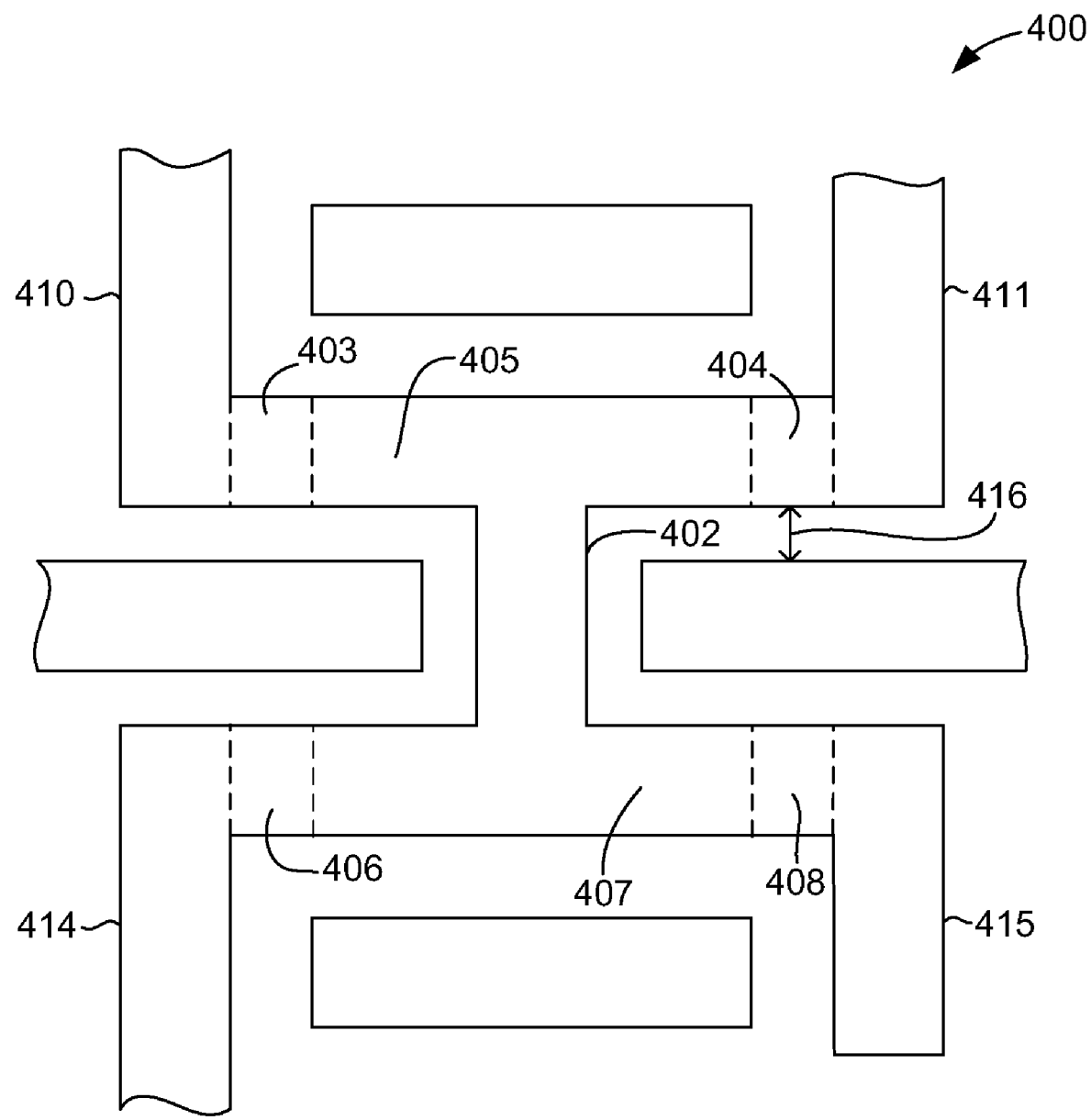
FIG. 4 is a plan view of a portion of a node plate array 400 of an integrated capacitor according to another embodiment.

FIG. 4 is a plan view of a portion of a node plate array 400 of an integrated capacitor according to another embodiment. Comparing the H-element 202 of FIG. 2A, the H-element 402 of FIG. 4 includes side extensions 403, 404, 406, 408 linking the side elements 405, 407 of the H-element 402 to node plate links 410, 411, 414, 415. The side extensions provide additional intra-layer capacitance, such as shown by double-ended arrow 416, and to reduce resistance of node plate links by interconnecting the H-element with the node plate links in the metal layer. As described in reference to FIG. 2A, the side elements, which extend along the X-direction are the same node polarity as the links 410, 411, 414, 415 extending along the Y-direction. An integrated capacitor according to FIG. 4 has a second or third metal layer(s) above or below the layer shown in FIG. 4 rotated ninety degrees. Alternatively, an integrated capacitor according to FIG. 4 has a differently patterned metal layer, such as the pattern shown in FIG. 2B, above or below the layer of FIG. 4.

Note that the types of and number of layers described are merely examples, and in some embodiments other suitable layers may be used, and any number of layers may be used. For example, the layers used may depend on the types and numbers of layers that are available in the manufacturing process, and other arrangements will be apparent to those of skill in the art. In general, any suitable layer, and an arbitrary number of layers may be used in accordance with embodiments of the present invention.

Figure 5:
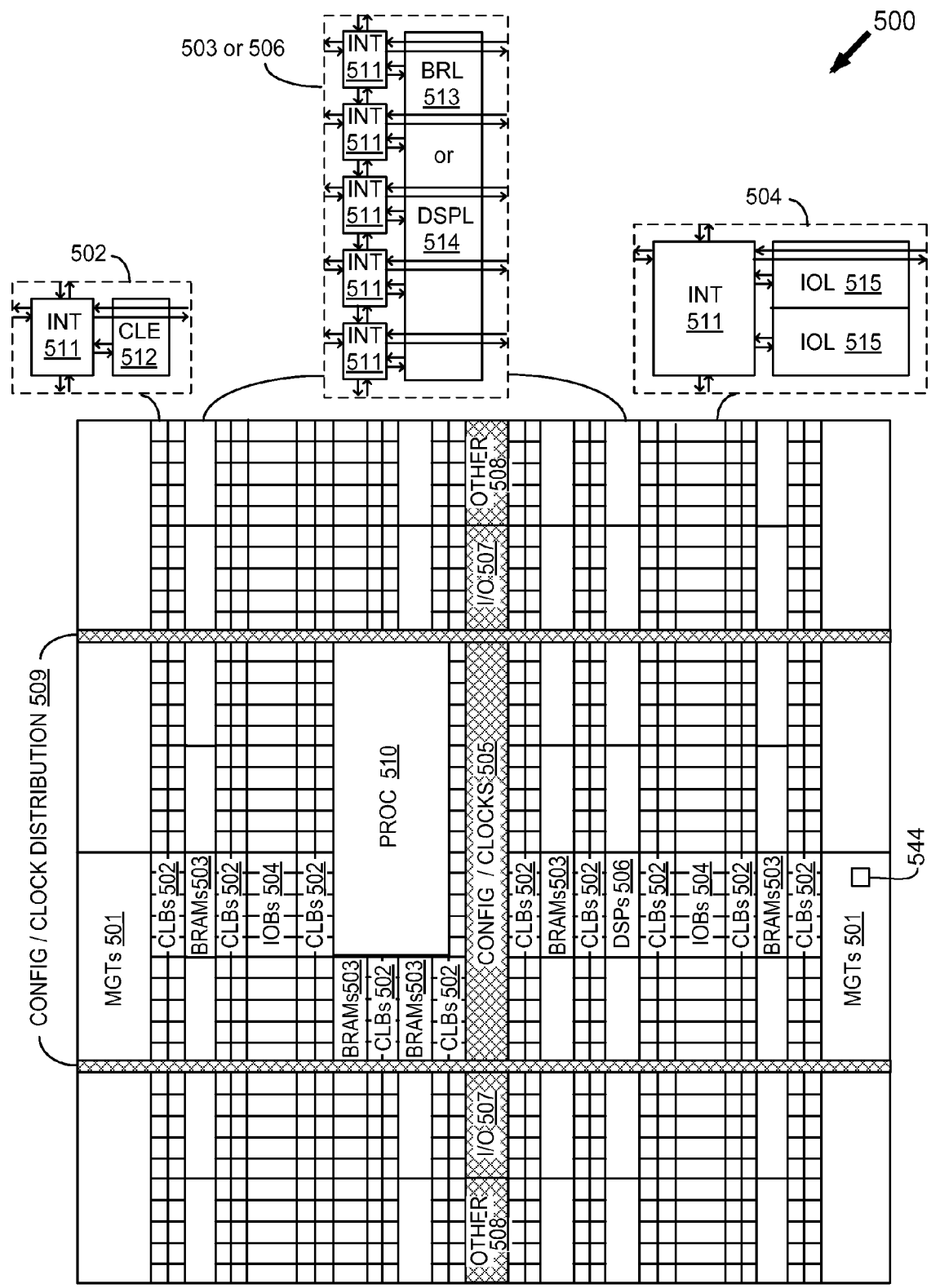
FIG. 5 is a plan view of an FPGA incorporating an integrated capacitor according to an embodiment.

FIG. 5 is a plan view of an FPGA 500 incorporating one or more integrated capacitors according to embodiments. The FPGA 500 includes CMOS portions in several of the functional blocks, such as in RAM and logic, and is fabricated using a CMOS fabrication process. One or more integrated capacitors 544 according to one or more embodiments of the invention are incorporated in any of several functional blocks of the FPGA, such as an I/O section, transceiver, or power supply distribution network.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps.

What is claimed is:

1. A capacitor in an integrated circuit ("IC") comprising:
   a first metal layer;
   a second metal layer;
   a first row of node plate links connected to a first node of the capacitor extending along a first axis of a node plate array, including a first plurality of rectangular node plate links formed in the first metal layer alternating with a second plurality of rectangular node plate links formed in the second metal layer; and
   a first column of node plate links connected to a second node of the capacitor extending along a second axis of the node plate array perpendicular to the first axis, including a third plurality rectangular node plate links formed in the first metal layer alternating with a fourth plurality of rectangular node plate links formed in the second metal layer, a first rectangular node plate link having a length and a width in the first row formed in the first metal layer crossing over a second rectangular node plate link in the first column formed in the second metal layer.

2. The capacitor of claim 1 wherein the second rectangular node plate link has the length and the width.

3. The capacitor of claim 2 wherein a portion of the second rectangular node plate link overlain by the first rectangular node plate link is a square portion.

4. The capacitor of claim 1 further comprising a first via and a second via electrically connecting the first rectangular node plate link to the second rectangular node plate link at a first end of the first rectangular node plate link.

5. The capacitor of claim 1 wherein the length is 6 f and the width is 3 f, f being a minimum critical dimension of the first metal layer.

6. The capacitor of claim 1 wherein an aspect ratio of the length to the width is not greater than 5:1.

7. The capacitor of claim 1 further comprising
a first bus bar extending along the second axis at a first edge of the node plate array electrically connected to the first row of node plate links;
a second bus bar extending along the second axis at a second edge of the node plate array opposite the first edge and electrically connected to the first row of node plate links;
a third bus bar extending along the first axis at a third edge of the node plate array electrically connected to the first column of node plate links; and
a fourth bus bar extending along the first axis at a fourth edge of the node plate array opposite the third edge electrically connected to the first column of node plates.

8. The capacitor of claim 7 further comprising a second node plate array having a second row of node plate links electrically connected to the first bus bar extending away from the first node plate array.

9. The capacitor of claim 1 wherein the first row of node plate links includes a first plurality of H-elements formed in the first metal layer and the first column of node plate links includes a second plurality of H-elements formed in the second metal layer, each of the first plurality of H-elements overlying corresponding H-elements of the second plurality of H-elements, each of the first plurality of H-elements being rotated ninety degrees relative to the corresponding H-elements.

10. The capacitor of claim 9 wherein a particular one of the first plurality of H-elements includes a plurality of side extensions, and a particular one of the second plurality of H-elements includes another one of the plurality of side extensions.

11. The capacitor of claim 1 wherein the first node of the capacitor is electrically equivalent to the second node of the capacitor.

12. The capacitor of claim 11 wherein the IC is a field-programmable gate array ("FPGA") and the capacitor is in a transceiver section of the FPGA.

13. The capacitor of claim 1 wherein the capacitor is located in an analog-to-digital converter.

14. The capacitor of claim 1 wherein the integrated circuit is a field programmable gate array.

\* \* \* \* \*